(12) United States Patent
Fjelstad et al.

(10) Patent No.: US 7,205,613 B2
(45) Date of Patent: Apr. 17, 2007

(54) INSULATING SUBSTRATE FOR IC PACKAGES HAVING INTEGRAL ESD PROTECTION

(75) Inventors: Joseph C. Fjelstad, Maple Valley, WA (US); Kevin P. Grundy, Fremont, CA (US)

(73) Assignee: Silicon Pipe, San Jose, CA (US)

( * ) Notice: Subject to any disclaimer, the term of this patent is extended or adjusted under 35 U.S.C. 154(b) by 0 days.

(21) Appl. No.: 11/033,354

(22) Filed: Jan. 7, 2005

(65) Prior Publication Data

US 2005/0146821 A1    Jul. 7, 2005

Related U.S. Application Data

(60) Provisional application No. 60/535,155, filed on Jan. 7, 2004.

(51) Int. Cl.
   *H01L 23/62*    (2006.01)

(52) U.S. Cl. ............... 257/355; 257/356; 257/357; 257/360; 257/361; 257/362; 257/678; 257/774

(58) Field of Classification Search ............... 257/678, 257/691, 784, 355, 356, 360, 361, 362
See application file for complete search history.

(56) References Cited

U.S. PATENT DOCUMENTS 6,476,472 B1 *  11/2002  Davison et al. ............. 257/678
2003/0089979 A1 *  5/2003  Malinowski et al. ........ 257/724

* cited by examiner

*Primary Examiner*—Evan Pert
*Assistant Examiner*—Tan Tran
(74) *Attorney, Agent, or Firm*—Ronald R. Shea, Esq.

(57) ABSTRACT

An IC package substrate having integral ESD protection features and elements and a method for construction of the same are disclosed

17 Claims, 5 Drawing Sheets

INSULATING SUBSTRATE FOR IC PACKAGES HAVING INTEGRAL ESD PROTECTION

CROSS-REFERENCE TO RELATED APPLICATIONS

This application claims priority from, and hereby incorporates by reference, U.S. Provisional Application No. 60/535,155, filed Jan. 7, 2004 and entitled: "Insulating Substrate for IC Packages Having Integral ESD Protection."

FIELD OF THE INVENTION

The present invention relates to the field of substrates for electronic interconnection structures for IC packaging and more specifically relates to the protection of integrated circuit devices from Electro Static Discharge (ESD) within IC packages.

BACKGROUND

As the electronics industry of today is increasingly finding that the design and manufacture of integrated circuit (IC) packaging substrates is being challenged to ever greater degrees by the increased performance demands of advanced highly integrated IC designs, there is need to reconsider design and manufacturing methods used in their construction. One of the areas of challenge is related to control of electrostatic discharge (ESD) in IC packages. ESD is capable of damaging or destroying IC chips. Moreover, the concern is magnified as the feature size on these chips become smaller. Traditionally, ESD protection is provided on the chip. However, this causes the chip design to allocate valuable chip real estate to create the circuits capable of preventing such damage. In addition, the creation of on chip ESD protection reduces the I/O performance of the chip. ESD protection circuits add load capacitance to I/O which, for high speed signals, affects the ability of the I/O signal to switch quickly.

Methods and structures that remove ESD protection from the chip can provide significant benefit by allowing smaller and less expensive chips to be designed while simultaneously providing higher levels of performance. Without protection from ESD, IC circuitry can be fatally damaged by inadvertent discharge of static build up. Worse yet, ESD damage may not manifest itself right away and result in a failure much later in an IC's life. The static charge itself can be generated and discharged in accordance with a number of natural causes and there have been models developed to aid in the determination of how much protection is required in different circumstances and environments.

There are three primary ESD models for determining protection needs for integrated circuits. The first model is the human body model which simulates the ESD event when an individual, being charged to either a positive or negative potential, comes in contact with or touches an IC. The highest protection classification (Class 3B) for this model is greater than 8000 volts. This means that the ESD protection circuits must safely dissipate voltages over several thousand volts. The second model is the charged device model which simulates an ESD event where a device charges to a certain potential and brought into contact with a conductive surface at a different potential. The highest protection classification (Class C7) for the charged device model is greater than 2000 volts. The last model is the machine model, which simulates the ESD event that occurs when a part of an equipment or tool comes into contact with a device at a different potential. The highest protection classification (Class M4) for the machine model is less than 200 volts. Of these models the human body and charged device models are considered to be most relevant to "real world" conditions and concerns.

So as not to stress ESD protection circuits during manufacturing a variety of different techniques are employed. The most fundamental method is to make certain that all elements of the system, including people, are fully grounded to prevent the buildup of charge in the first place. A second method is to ionize the air to neutralize any charging of the air itself. Most important, ESD protection is a necessary element within a semiconductor device itself. Semiconductors commonly have an ESD circuit to protect their input/output signal paths from electrostatic discharge. Typically, the ESD circuit is integrated within the IC as part of the overall circuit design. Protection at the die level is commonly designed to have the circuit protect the IC at human body model levels, which is the most challenging, and consequently most likely to cause problems for high speed I/O (multi-Gigabit rates)

Given the risk to the ICs there is an obvious and ongoing need for the creation of some measure of ESD protection circuits on the chip itself. The most commonly implemented solution is applied near the I/O terminals. Unfortunately there is a price to be paid for putting protection circuit on the chip and it comes in the form of both reduced active silicon yield (because of the space on the chip consumed by the protection circuits) and the reduction in IC performance due to the parasitic capacitance associated with these protective circuits. Even a well designed ESD protection circuit can add several picofarads worth of capacitance thereby rendering the I/O unusable for high speed operation. However, if one could move most of the ESD protection off of the chip and into the package, or split the ESD protection between the chip and package, significant benefits in both cost and performance are possible. There would still be need for machine model levels of ESD protection on the chip but such circuits would be much smaller and more space conservative and less damaging to high performance.

ESD control methodologies for improving performance described in the prior art have placed an IC and separate ESD protection together in a single package to protect and enhance the performance of the integrated circuit die, one of the shortcomings of those methods is that they require the use of off chip semiconductor devices to switch current surges to ground, which increases assembly complexity. Thus ESD remains a recognized peril to integrated circuits. With semiconductor features shrinking, it is becoming increasingly more difficult to protect the delicate internal transistors and still maintain performance and while current solutions are adequate for the moment, the inclusion of human body model ESD protection on the chip will remain both expensive and performance limiting and there is need to find other solutions. Readjusting how and where ESD protection is applied is certain to yield significant benefits to the electronics industry and alternative methods are herein disclosed that provide the necessary ESD protection at a lower cost than current approaches.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
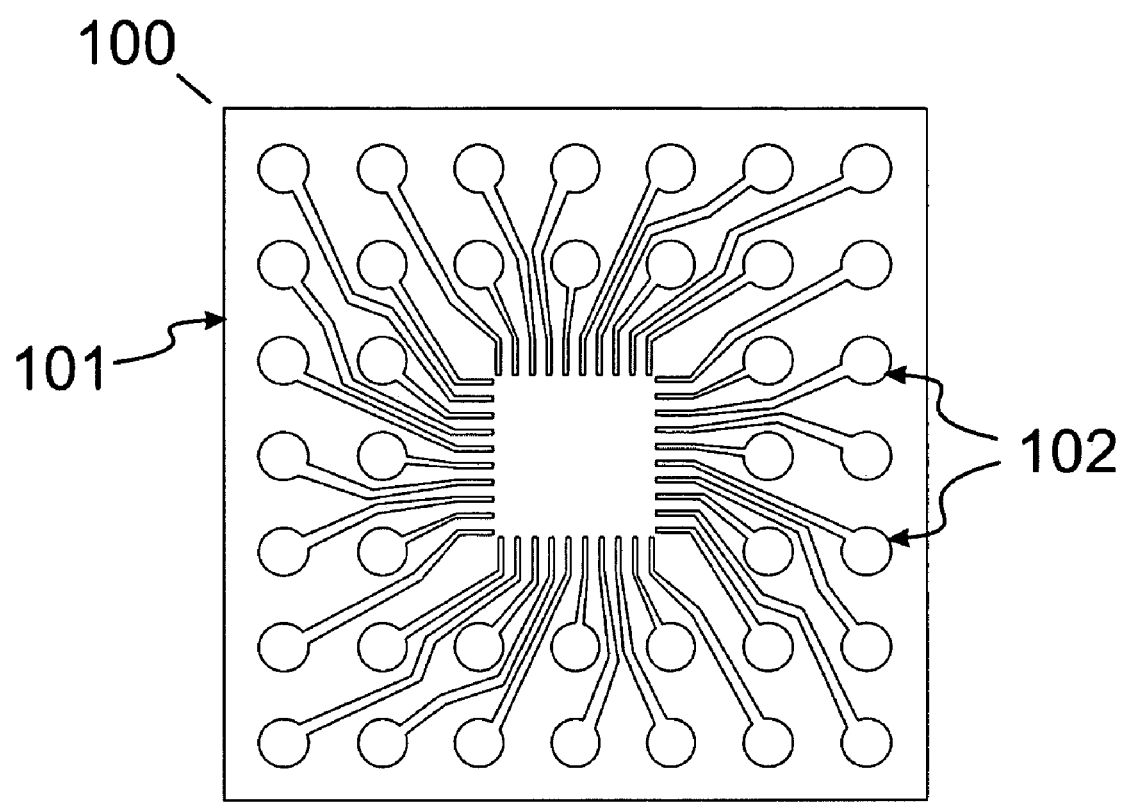
FIG. 1 provides an example of prior art represented by an IC package substrate having interconnection circuits on a continuous substrate material.

Typical IC packages are comprised of circuits and insulators and do not provide ESD protection. An example of a typical area array package is provided in FIG. 1. In the figure the IC package substrate 100 is comprised of an insulating base material 101 on which is disposed redistribution circuits 102 which serve to interconnect the fine pitch I/O terminals on the chip to I/O terminals which allow for package egress at a larger I/O pitch. While the insulation material is critical for mechanical support and dimensional stability of the circuits it was noted that if the voltage breakdown limit of the material was low enough, it could naturally serve as a path to ground under ESD conditions. Unfortunately in order for the material to do this, it would likely be too thin to be practical for mechanical purposes. A solution to this problem is to create a substrate material that has areas and locals that could provide path ways from circuits to ground that would be preferentially used by ESD events thus protecting the IC.

There are a number of potential materials that could be interposed between the circuits and ground that could provide such a potential path. The simplest and most widely available is air. For example, an air gap of 25 µm will provide a spark gap at approximately 40 volts, a value which is suitable for the needs of IC protection. While air is suitable, there are practical matters that must be addressed to meet manufacturing needs.

In addition to air, certain polymer materials, such as those described by Schrier, et al. in U.S. Pat. No. 4,726,991, have been developed that are capable of rapidly shunting power spikes (i.e. electrostatic discharges) to ground and/or to power to protect the integrated circuit presently exist. Thus in other embodiments of the present invention, ESD protection is made an integral element of the base material used for manufacturing IC packages.

Figure 2:
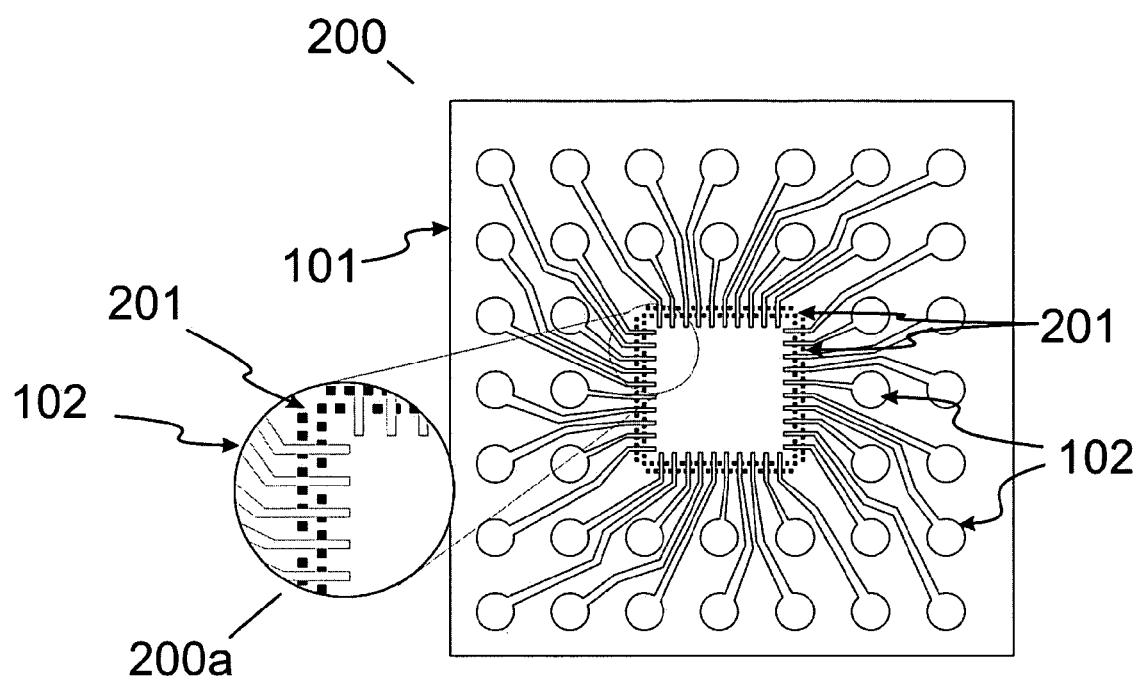
FIG. 2 illustrates an embodiment of the invention comprising an IC package substrate with redistribution circuits and having an ordered and localized array of ESD protection features.

In FIG. 2 is shown an embodiment of the invention wherein an IC package interconnection substrate 200 has redistribution circuits 102 residing on an insulating base material 101. In the enlarged image 200a, the circuit redistribution traces 102 are shown to be overlapping an ordered pattern of multiple ESD protective material areas 201. In this matter the material is placed near or directly beneath I/O terminations providing a shunting pathway to ground and/or power planes/rings residing on the opposite side of the insulating material. (not shown). Although the enlarged image 200a shows circuits intersecting multiple ESD protective areas, the number of intersections can be a single intersection or many. In addition, one or more of the circuits could be connected to the metal ground or power layer on the opposite side by a suitable means such as a metal plated via.

Figure 3:
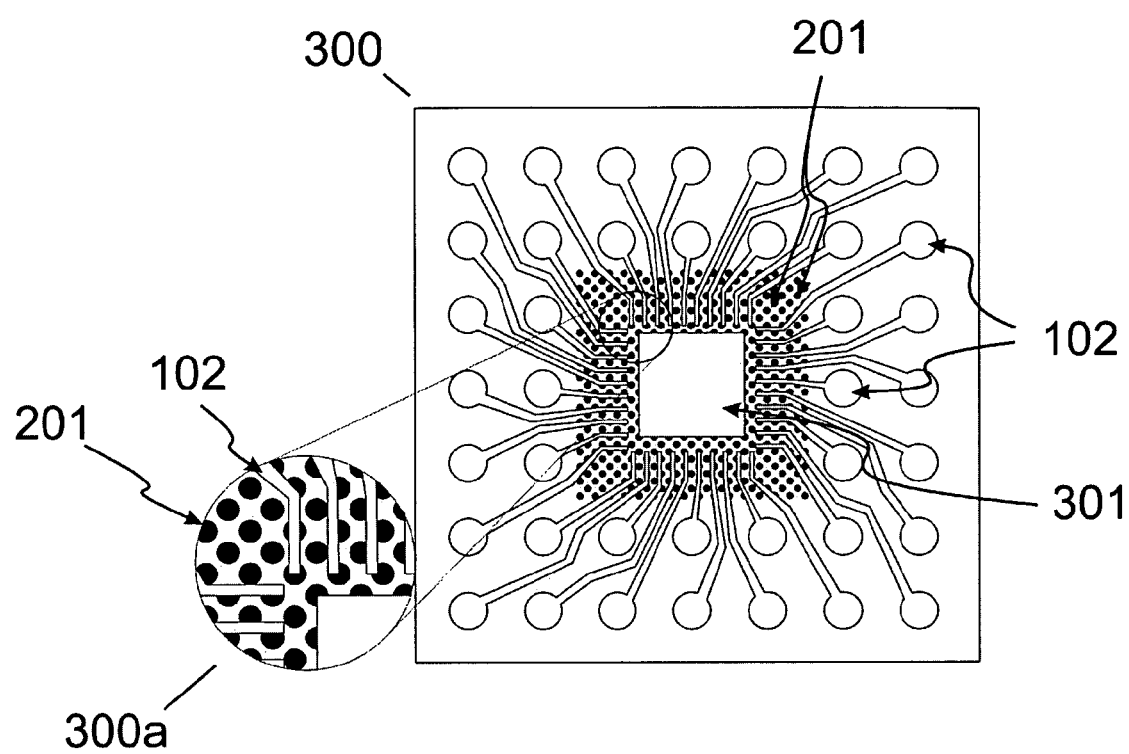
FIG. 3 illustrates an embodiment of the invention comprising an IC package substrate with redistribution circuits and having a more randomized and broader area coverage of ESD protection features.
Figure 4:
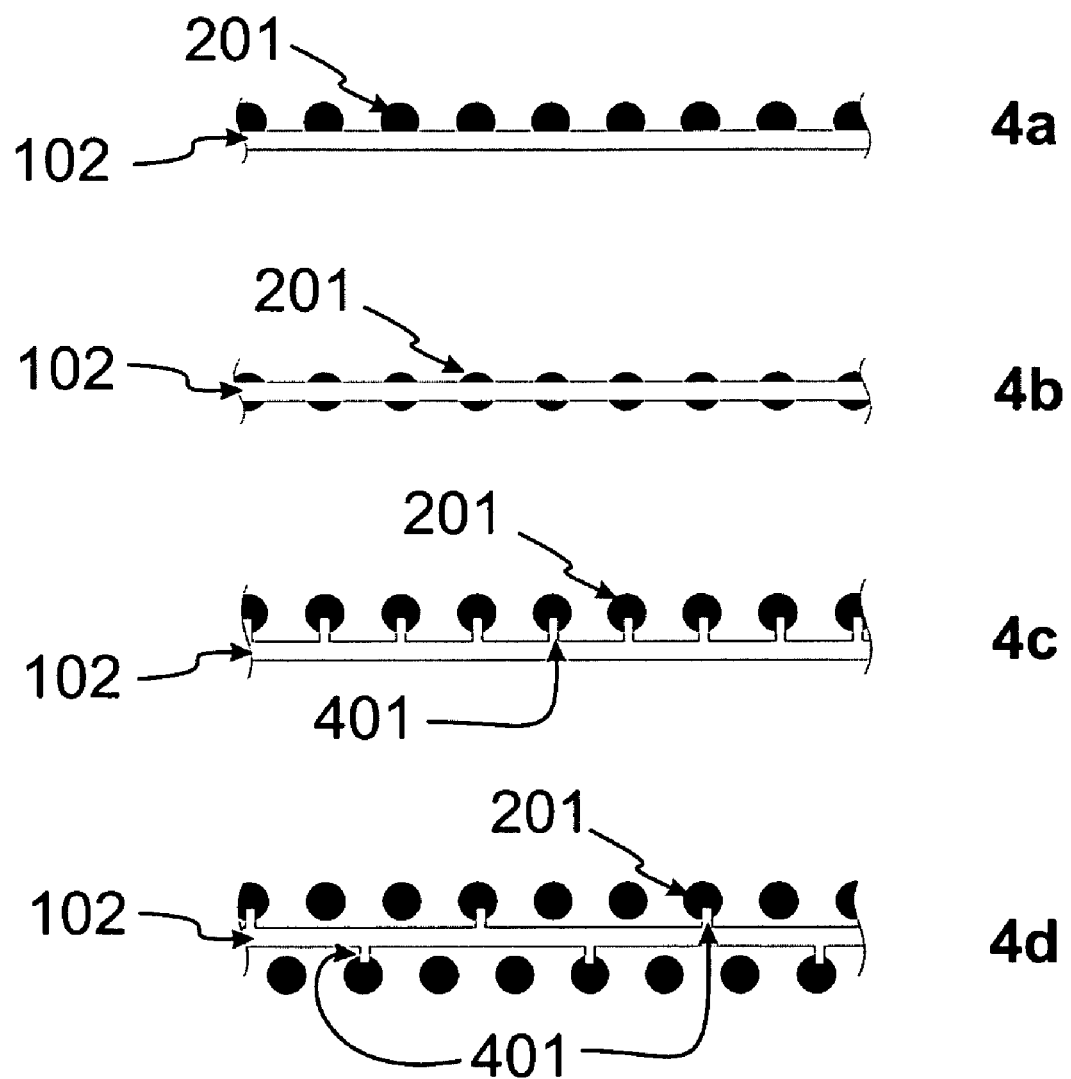
FIG. 4a–4d illustrate optional constructions and placement of the conductors relative to the ESD protection features FIG. 5 A–I illustrates a prospective process for manufacturing and embodiment of the invention.

In FIG. 3 is shown an embodiment of the invention wherein an IC package interconnection substrate 300 has redistribution circuits 102 residing on an insulating base material 101. In the enlarged image 300a, the circuit redistribution traces 102 are shown to be overlapping multiple ESD protective material areas 201 and there is a central die attach pad 301. The ESD protective material areas 201 are placed into a pattern covering a larger area of the substrate to provide a greater number of potential shunting pathways to ground or power. The pattern of the ESD protective material areas may be arranged so that circuit traces randomly intersect the ESD areas as they make their way from the center of the substrate (where the chip resides) 301 to the edge of the substrate where the circuit trace terminates 102. A FIGS. 4a through 4d illustrates alternatively embodiments of the pattern of the ESD protective material features. In the figures the circuits 102 are arranged so that circuit traces intersect multiple ESD areas 201 in a deliberate and exact manner, inclusive of the number of ESD protective material areas as well as the amount of overlap a circuit trace achieves with a particular ESD protective material area (not shown). Also illustrated in the figure are constructions having lateral protrusions 401 having respective distal ends disposed within respective ESD protective material areas 201. illustrates how circuit traces may be arranged in different overlap configurations. As with FIG. 2, one or more of the circuits could be connected to the metal ground or power layer on the opposite side by a suitable means such as a metal plated via.

Figure 5:
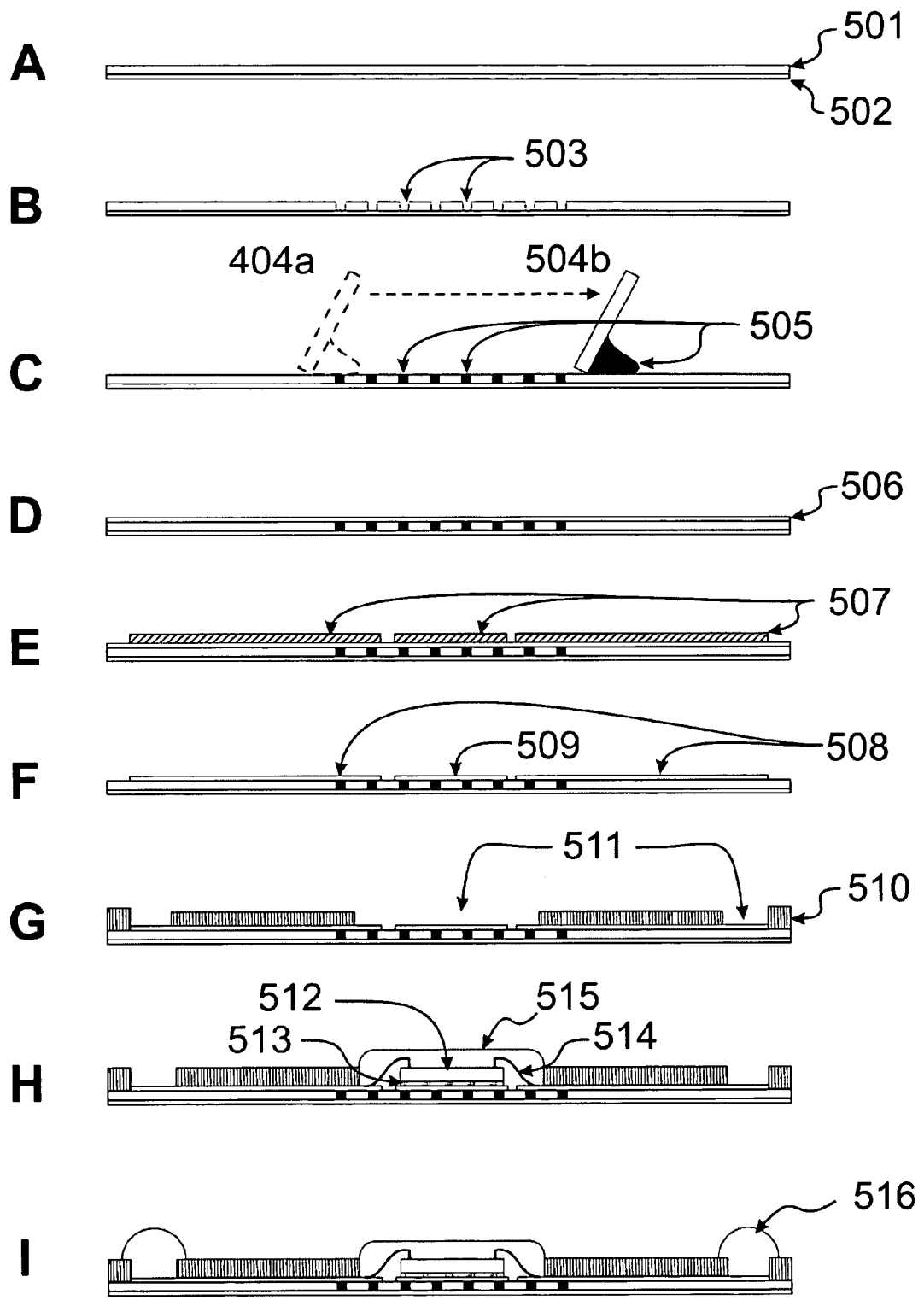

In FIG. 5A through FIG. 5I is illustrated a process for fabricating an embodiment of the invention. In FIG. 5A, an insulating base material film 501, (e.g. polyimide, LCP, FR4, etc) is either created on or laminated to a metal foil 502 such as copper. In FIG. 5B, holes 503 are place either randomly or in a pattern in the material to access the metal foil through the insulating material. In FIG. 5C, a squeegee pushing a suitable voltage switchable material 505 is pushed from position 504a to 504b and depositing the material into the previously open holes. Deposition of the suitable voltage switchable material is not limited to a squeegee methodology and may include sputter or other material deposition processes. The finished height level of the suitable voltage switchable material is equal to the height of the film, creating an exact and predictable thickness value for the ESD voltage switchable material to assure consistent performance. In FIG. 5D, the surface is then metallized or coated with a metal layer (e.g. copper) 506 using a suitable method. In FIG. 5E, the circuit pattern and other designs are defined on the metal layer 506 by an etch resist 507. In FIG. 5F, the circuit features, such as redistribution circuits 508 and die attach pad 509, are stripped of etch resist to expose the metal. The exposed metal may or may not be over plated with other metals (e.g. nickel and gold) to provide a wire bondable surface. For flip chip constructions the metal itself may be suitable. In FIG. 5G, an insulating polymer, such as a solder mask 510 can then be applied to protect the circuit and leave open areas for interconnection to both the chip and to next level interconnections 511. In FIG. 5H, is illustrate a wire bond treatment of the IC package wherein an IC chip 512 is attached to the die attach pad using a suitable die attach adhesive 513 and the IC is interconnected to the circuits on the packaging substrate by means of wires 514 and the assembly is protected by a suitable encapsulant 515.

In FIG. 5I, the completed package assembly with integral ESD protection material can next be provided with suitable terminations such as solder balls 516.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. An integrated circuit package assembly with integral electrostatic discharge (ESD) protection, the integrated circuit package assembly comprising:
   an integrated circuit die;
   circuit layer traces interconnected to the integrated circuit die;
   an insulting base layer, wherein a portion of the circuit layer traces are disposed along a first side of the insulating base layer;
   a conductive layer disposed on the second side of the insulating base layer; and
   ESD paths extending from the first side of the insulating base layer to the second side of the insulating base layer, wherein at least some of the circuit layer traces are in electrical contact with at least one ESD path.

2. The integrated circuit package assembly of claim 1 wherein the ESD paths comprise a gas.

3. The integrated circuit package assembly of claim 2 wherein the gas comprises air.

4. The integrated circuit package assembly of claim 2 wherein each of the ESD paths are in physical contact with at least one of the circuit layer traces, and with the conductive layer.

5. The integrated circuit package assembly of claim 1 wherein the ESD paths comprise a voltage-switchable material.

6. The integrated circuit package assembly of claim 1 wherein the integrated circuit die is coupled to the first side of the insulating layer by a die adhesive.

7. The integrated circuit package assembly of claim 1 wherein the ESD paths are configured to prevent electrical current flow between the circuit layer traces and the conductive layer when a voltage potential between the circuit layer traces and the conductive layer is below a predetermined discharge voltage, and to permit an electrical discharge current when the voltage potential between the circuit layer traces and the conductive layer exceeds the predetermined discharge voltage.

8. The integrated circuit package assembly of claim 7 wherein the electric discharge current is a spark.

9. The integrated circuit package assembly of claim 7 wherein the predetermined threshold voltage is approximately 40 volts.

10. The integrated circuit package assembly of claim 1 wherein the thickness of the insulating base layer is approximately 25 μm.

11. The integrated circuit package assembly of claim 1 wherein the ESD path is a polymer.

12. The integrated circuit package assembly of claim 1 wherein the ESD path comprises a squeegeeable material.

13. The integrated circuit package assembly of claim 1 wherein the ESD path comprises a sputterable material.

14. The integrated circuit package assembly of claim 1 wherein the conductive layer comprises copper.

15. The integrated circuit package of claim 1 further comprising a next-level interconnect zone.

16. The integrated circuit package assembly of claim 15 wherein the next-level interconnect zone comprises:
   a) a hole in the insulating base layer extending from the first side of the insulating base layer to the conductive layer; and
   b) a solder ball partially disposed within the hole, and electrically coupled to the conductive layer.

17. An integrated circuit package assembly comprising:
   a) an integrated circuit die having a plurality of terminals, the integrated circuit die coupled to a first side of an insulating layer;
   b) a conductive layer coupled to a second side of an insulating layer;
   c) a plurality of redistribution circuits disposed on the first side of the insulating layer, wherein at least some of the redistribution circuits have a narrow trace portion coupled to a respective terminal on the integrated circuit die; and
   d) a plurality of ESD paths extending from the first side of the insulating layer to the conductive layer, wherein at least some of the redistribution circuits are in electrical contact with at least one ESD path.

* * * * *